United States Patent
Tsukamoto et al.

(10) Patent No.: US 10,242,904 B2
(45) Date of Patent: Mar. 26, 2019

(54) TRANSFER APPARATUS, PROCESSING APPARATUS, AND TRANSFER METHOD

(71) Applicant: DISCO CORPORATION, Tokyo (JP)

(72) Inventors: Masahiro Tsukamoto, Tokyo (JP); Ken Togashi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/793,574

(22) Filed: Oct. 25, 2017

(65) Prior Publication Data

US 2018/0130688 A1 May 10, 2018

(30) Foreign Application Priority Data

Nov. 10, 2016 (JP) .................................. 2016-219619

(51) Int. Cl.
| | |
|---|---|
| *H01L 21/687* | (2006.01) |
| *B23K 26/02* | (2014.01) |
| *B23K 26/10* | (2006.01) |
| *H01L 21/268* | (2006.01) |
| *H01L 21/78* | (2006.01) |
| *H01L 21/677* | (2006.01) |

(52) U.S. Cl.
CPC ............ *H01L 21/687* (2013.01); *B23K 26/02* (2013.01); *B23K 26/10* (2013.01); *H01L 21/268* (2013.01); *H01L 21/67766* (2013.01); *H01L 21/67778* (2013.01); *H01L 21/68707* (2013.01); *H01L 21/78* (2013.01)

(58) Field of Classification Search
CPC ............ H01L 21/687; H01L 21/67766; H01L 21/67778; H01L 21/68707
USPC ............ 414/222.01, 222.12, 225.01, 222.07, 414/217.1
See application file for complete search history.

(56) References Cited

U.S. PATENT DOCUMENTS

| | | | |
|---|---|---|---|
| 2007/0029227 A1* | 2/2007 | Bonora ............. | H01L 21/67383 206/711 |
| 2007/0238062 A1* | 10/2007 | Asari .................. | F27B 17/0025 432/253 |
| 2009/0101067 A1* | 4/2009 | Bonora ............. | H01L 21/67766 118/503 |
| 2009/0196724 A1* | 8/2009 | Chen ................. | H01L 21/68707 414/590 |

(Continued)

FOREIGN PATENT DOCUMENTS

| | | |
|---|---|---|
| JP | 2012-084720 | 4/2012 |
| JP | 2014-192215 | 10/2014 |

*Primary Examiner* — Kaitlin S Joerger

(74) *Attorney, Agent, or Firm* — Greer Burns & Crain Ltd.

(57) ABSTRACT

A frame unit is transferred from a cassette to a predetermined position. The frame unit has a platelike workpiece, a tape attached to the workpiece, and a ring frame supporting a peripheral portion of the tape. The apparatus includes a holding unit for the frame unit, a moving unit for the holding unit, and a control unit. The holding unit includes a pair of gripping portions for gripping a front portion of the ring frame at two separate positions, and an abutting portion adapted to abut against the outer circumference of the ring frame. The ring frame is gripped, partially drawn from the cassette, and released. The abutting portion is brought into abutment against the outer circumference of the ring frame so as to move the ring frame into the cassette. The ring frame is gripped again, raised, and transferred to the predetermined position.

3 Claims, 6 Drawing Sheets

(56) References Cited

U.S. PATENT DOCUMENTS

| | | | | |
|---|---|---|---|---|
| 2010/0209225 A1* | 8/2010 | Matsuo | ............ | H01L 21/67742 |
| | | | | 414/744.5 |
| 2012/0189408 A1* | 7/2012 | Bonora | ............ | H01L 21/67766 |
| | | | | 414/222.01 |
| 2014/0030048 A1* | 1/2014 | Kosuge | ................ | H01L 21/677 |
| | | | | 414/225.01 |
| 2014/0356107 A1* | 12/2014 | Bonora | ............ | H01L 21/67383 |
| | | | | 414/288 |
| 2015/0314459 A1* | 11/2015 | Hosek | ............... | H01L 21/67742 |
| | | | | 414/744.5 |
| 2015/0332950 A1* | 11/2015 | Mazzocco | ............ | H01L 21/683 |
| | | | | 414/816 |
| 2015/0360370 A1* | 12/2015 | Mazzocco | ............ | B25J 15/0608 |
| | | | | 414/808 |
| 2016/0329227 A1* | 11/2016 | Hashimoto | ........ | H01L 21/67207 |
| 2018/0029237 A1* | 2/2018 | Sugawara | ................ | B25J 13/08 |
| 2018/0141219 A1* | 5/2018 | Bonora | ............ | H01L 21/67383 |
| 2018/0151399 A1* | 5/2018 | Goto | ................ | H01L 21/67766 |

\* cited by examiner

TRANSFER APPARATUS, PROCESSING APPARATUS, AND TRANSFER METHOD

BACKGROUND OF THE INVENTION

Field of the Invention

The present invention relates to a transfer apparatus for transferring a frame unit composed of a platelike workpiece, a tape attached to the workpiece, and a ring frame supporting a peripheral portion of the tape, the ring frame having an opening closed by the tape for receiving the workpiece, and also relates to a processing apparatus including this transfer apparatus and a transfer method using this transfer apparatus.

Description of the Related Art

In dividing a platelike workpiece such as a semiconductor wafer, an optical device wafer, and a ceramics package substrate into a plurality of chips, a laser beam is applied along division lines (streets) set on the workpiece or a cutting blade being rotated is fed along these division lines (see Japanese Patent Laid-open Nos. 2012-84720 and 2014-192215, for example).

In many cases, a frame unit is formed prior to processing the workpiece by using the above method, in which the frame unit is composed of the workpiece, a tape attached to the workpiece, and a ring frame fixed to a peripheral portion of the tape having a diameter larger than that of the workpiece. By forming the frame unit, the workpiece can be protected from any shock or the like in transferring and processing the workpiece. Further, the ease of handling of the workpiece can be improved.

In general, the workpiece of the frame unit is held on a chuck table in processing the workpiece in the condition where the exposed side of the workpiece where the tape is not attached is oriented upward. Alternatively, there is also a case that the exposed side of the workpiece where the tape is not attached is oriented downward, depending upon the kind of processing. Accordingly, a transfer apparatus for transferring the frame unit is required to have a function of inverting the frame unit.

SUMMARY OF THE INVENTION

Such a transfer apparatus having an inverting function must have rigid parts, so as to reliably hold the frame unit. However, in the case that a holding unit for holding the frame unit is composed of thick members, there is a possibility that the holding unit cannot be inserted into a narrow space between any adjacent ones of plural frame units stored in a cassette, so that a target one of the plural frame units cannot be held by the holding unit.

Further, a conventional processing apparatus includes a centering mechanism having guide rails for positioning the frame unit transferred from the cassette. Accordingly, after transferring the frame unit from the cassette to the centering mechanism, the frame unit is further transferred from the centering mechanism to the chuck table. However, this centering mechanism requires a considerable space for installation, causing a hindrance in reducing the size of the processing apparatus.

It is therefore an object of the present invention to provide a transfer apparatus which can reliably hold and transfer a frame unit stored in a cassette and can contribute to a reduction in size of a processing apparatus.

It is another object of the present invention to provide a processing apparatus including this transfer apparatus.

It is a further object of the present invention to provide a transfer method using this transfer apparatus.

In accordance with an aspect of the present invention, there is provided a transfer apparatus for transferring a frame unit from a cassette to a predetermined position, the frame unit being composed of a platelike workpiece, a tape attached to the workpiece, and a ring frame supporting a peripheral portion of the tape, the ring frame having an opening closed by the tape for receiving the workpiece, the transfer apparatus including a holding unit for holding the frame unit, the holding unit having a pair of gripping portions for gripping a front portion of the ring frame at two separate positions and an abutting portion adapted to abut against the outer circumference of the ring frame; a moving unit for moving the holding unit; and a control unit for controlling the holding unit and the moving unit; the control unit controlling the holding unit and the moving unit by performing the steps of gripping the ring frame by operating the gripping portions, next partially drawing the ring frame from the cassette by operating the moving unit, next canceling the gripping of the ring frame by operating the gripping portions, next bringing the abutting portion into abutment against the outer circumference of the ring frame so as to move the ring frame into the cassette by operating the moving unit, next gripping the ring frame again by operating the gripping portions, next raising the ring frame by operating the moving unit, and finally transferring the ring frame to the predetermined position by operating the moving unit.

In accordance with another aspect of the present invention, there is provided a processing apparatus including a transfer unit for transferring a frame unit from a cassette to a predetermined position, the frame unit being composed of a platelike workpiece, a tape attached to the workpiece, and a ring frame supporting a peripheral portion of the tape, the ring frame having an opening closed by the tape for receiving the workpiece; a chuck table for holding the workpiece; a processing unit for processing the workpiece held on the chuck table; and a cassette mounting area for mounting the cassette; the transfer unit including a holding unit for holding the frame unit, the holding unit having a pair of gripping portions for gripping a front portion of the ring frame at two separate positions and an abutting portion adapted to abut against the outer circumference of the ring frame; a moving unit for moving the holding unit; and a control unit for controlling the holding unit and the moving unit; the control unit controlling the holding unit and the moving unit by performing the steps of gripping the ring frame by operating the gripping portions, next partially drawing the ring frame from the cassette by operating the moving unit, next canceling the gripping of the ring frame by operating the gripping portions, next bringing the abutting portion into abutment against the outer circumference of the ring frame so as to move the ring frame into the cassette by operating the moving unit, next gripping the ring frame again by operating the gripping portions, next raising the ring frame by operating the moving unit, and finally transferring the ring frame to the chuck table by operating the moving unit.

In accordance with a further aspect of the present invention, there is provided a transfer method for transferring a frame unit from a cassette to a predetermined position, the frame unit being composed of a platelike workpiece, a tape attached to the workpiece, and a ring frame supporting a peripheral portion of the tape, the ring frame having an opening closed by the tape for receiving the workpiece, the transfer method being performed by using a transfer apparatus including a holding unit for holding the frame unit, the holding unit having a pair of gripping portions for gripping a front portion of the ring frame at two separate positions and an abutting portion adapted to abut against the outer circumference of the ring frame; a moving unit for moving the holding unit; and a control unit for controlling the holding unit and the moving unit; the transfer method including a drawing step of gripping the ring frame by operating at least one of the pair of gripping portions and next partially drawing the ring frame from the cassette by operating the moving unit; an abutting step of canceling the gripping of the ring frame by operating the at least one of the pair of gripping portions after performing the drawing step, and next bringing the abutting portion into abutment against the outer circumference of the ring frame so as to move the ring frame into the cassette by operating the moving unit; and a transfer step of gripping the ring frame by operating the pair of gripping portions after performing the abutting step, next raising the ring frame by operating the moving unit, and finally transferring the ring frame to the predetermined position by operating the moving unit.

As described above, the transfer apparatus according to the present invention includes the pair of gripping portions for gripping the front portion of the ring frame at two separate positions and the abutting portion adapted to abut against the outer circumference of the ring frame. Accordingly, the frame unit stored in the cassette can be reliably held and transferred by the transfer apparatus in the following manner. That is, the ring frame is first gripped by the gripping portions and then partially drawn from the cassette by the moving unit. After canceling the gripping by the gripping portions, the abutting portion is brought into abutment against the outer circumference of the ring frame, so as to move the ring frame into the cassette. In the condition where the abutting portion abuts against the outer circumference of the ring frame, the ring frame is gripped by the gripping portions and then raised by the moving unit. Thus, the ring frame is gripped at two separate positions by the gripping portions. Accordingly, as compared with the case that the ring frame is gripped at one position, deformation of the ring frame can be suppressed and the ring frame can therefore be stabilized. As a result, the frame unit can be reliably held and can also be easily inverted. Further, by making the abutting portion abut against the outer circumference of the ring frame, the frame unit can be positioned in the cassette. Accordingly, in the condition where the frame unit is positioned by the abutting portion, the ring frame is gripped by the gripping portions to be transferred. As a result, it is unnecessary to position the frame unit by using a centering mechanism as used in the prior art. That is, it is unnecessary to provide a centering mechanism requiring a considerable space in the processing apparatus. Accordingly, the configuration of the transfer apparatus is also suitable for a reduction in size of the processing apparatus.

According to the present invention described above, it is possible to provide a transfer apparatus which can reliably hold and transfer a frame unit stored in a cassette and can contribute to a reduction in size of a processing apparatus. It is also possible to provide a processing apparatus including this transfer apparatus (transfer unit). It is also possible to provide a transfer method using this transfer apparatus.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
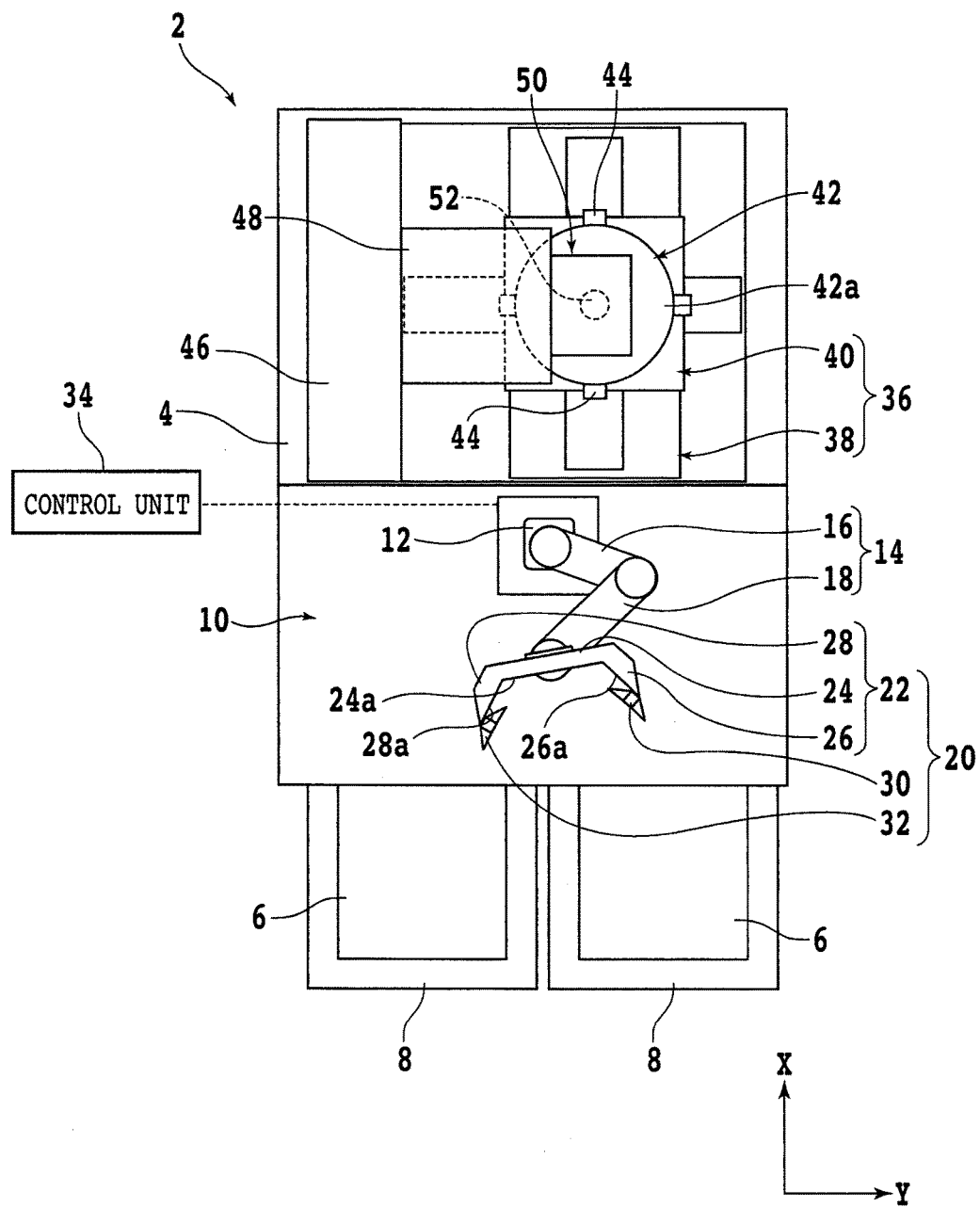
FIG. 1 is a schematic plan view illustrating the configuration of a laser processing apparatus.

A preferred embodiment of the present invention will now be described with reference to the attached drawings. FIG. 1 is a schematic plan view illustrating the configuration of a laser processing apparatus (processing apparatus) 2 according to this preferred embodiment. As illustrated in FIG. 1, the laser processing apparatus 2 includes a base 4 for supporting various components to be described later. Two cassette mounting areas 8 for individually mounting two cassettes 6 are formed on the front end of the base 4. Each cassette 6 is so designed as to store a plurality of frame units 1 (see FIG. 2A). A transfer unit (transfer apparatus) 10 for transferring each frame unit 1 is located on the rear side of the two cassette mounting areas 8. The transfer unit 10 includes an elevating mechanism (moving unit, moving means) 12 for vertically moving various components to be described later. A transfer arm (moving unit, moving means) 14 is connected to the elevating mechanism 12.

The transfer arm 14 is composed of a first arm 16 connected at its base end to the elevating mechanism 12 and a second arm 18 connected at its base end to the tip end of the first arm 16. The first arm 16 is horizontally swingable about its base end connected to the elevating mechanism 12, and the second arm 18 is horizontally swingable about its base end connected to the tip end of the first arm 16. A holding hand (holding unit, holding means) 20 for holding the frame unit 1 is provided at the tip end of the second arm 18. Accordingly, the holding hand 20 can be moved to a desired position by operating the elevating mechanism 12 to vertically move the transfer arm 14 and by horizontally swinging the first arm 16 and the second arm 18 individually with respect to the elevating mechanism 12 and the tip end of the first arm 16.

The holding hand 20 has a holding hand frame 22 invertably connected to the tip end of the transfer arm 14 (the second arm 18). The holding hand frame 22 is connected to the tip end of the second arm 18 and includes a straight first portion 24 adapted to abut against the frame unit 1 in transferring it. One of the opposite side surfaces of the straight first portion 24 functions as a first abutting surface (abutting portion, abutting means) 24a adapted to abut against the frame unit 1. The holding hand frame 22 further includes a second portion 26 and a third portion 28 obliquely projecting from the opposite ends of the first portion 24 to the side where the first abutting surface 24a of the first portion 24 is formed. One of the opposite side surfaces of the second arm 26 on the same side as the side where the first abutting surface 24a is formed functions as a second abutting surface (abutting portion, abutting means) 26a adapted to abut against the frame unit 1 in transferring it. Similarly, one of the opposite side surfaces of the third portion 28 on the same side as the side where the first abutting surface 24a is formed functions as a third abutting surface (abutting portion, abutting means) 28a adapted to abut against the frame unit 1 in transferring it. A gripping member (gripping portion, gripping means) 30 for gripping the frame unit 1 is provided on the second abutting surface 26a of the second portion 26 at its tip end. Similarly, a gripping member (gripping portion, gripping means) 32 for gripping the frame unit 1 is provided on the third abutting surface 28a of the third portion 28 at its tip end. Each of the gripping members 30 and 32 has an upper lug and a lower lug adapted to cooperatively grip a ring frame 23 constituting the frame unit 1 (see FIG. 2A).

A control unit (control unit, control means) 34 is connected to the transfer unit 10, so as to control the components of the transfer unit 10. The function of the control unit 34 will be hereinafter described. While the control unit 34 dedicated to the control of the transfer unit 10 is illustrated in this preferred embodiment, a control unit (not illustrated) for controlling various components of the laser processing apparatus 2 may be used for the control of the transfer unit 10.

A chuck table moving mechanism 36 is located on the rear side of the transfer unit 10. The chuck table moving mechanism 36 includes a Y moving table 38 adapted to be moved in the Y direction (indexing direction) depicted by an arrow Y in FIG. 1 and an X moving table 40 adapted to be moved in the X direction (feeding direction) depicted by an arrow X in FIG. 1. The Y moving table 38 is movably supported on the upper surface of the base 4, and the X moving table 40 is movably supported on the upper surface of the Y moving table 38. A chuck table 42 for holding a workpiece 11 constituting the frame unit 1 (see FIG. 2A) is provided on the upper surface of the X moving table 40. A plurality of clamps 44 for fixing the ring frame 23 of the frame unit 1 is provided on the outer circumference of the chuck table 42.

The chuck table 42 is connected to a rotational drive source (not illustrated) such as a motor and adapted to be rotated about a vertical axis substantially parallel to the Z direction (vertical direction) perpendicular to both the X direction and the Y direction. When the Y moving table 38 of the chuck table moving mechanism 36 is moved in the Y direction, the chuck table 42 is indexed in the Y direction, whereas when the X moving table 40 of the chuck table moving mechanism 36 is moved in the X direction, the chuck table 42 is fed in the X direction. Accordingly, the chuck table 42 is movable both in the X direction and in the Y direction. The chuck table 42 has an upper surface functioning as a holding surface 42a for holding the workpiece 11. The holding surface 42a is connected through a suction passage (not illustrated) to a vacuum source (not illustrated), in which the suction passage is formed inside the chuck table 42. Accordingly, when the frame unit 1 (the workpiece 11) transferred by the transfer unit 10 is placed on the holding surface 42a of the chuck table 42 and a vacuum produced by the vacuum source is applied through the suction passage to the holding surface 42a, the workpiece 11 can be held on the chuck table 42 under suction. While the frame unit 1 transferred by the transfer unit 10 is placed on the holding surface 42a of the chuck table 42 in this preferred embodiment, a temporary setting table may be located on the front side of the chuck table 42 and the frame unit 1 transferred by the transfer unit 10 may be placed on this temporary setting table. In this case, the frame unit 1 may be transferred from the temporary setting table to the chuck table 42 by using another transfer unit different from the transfer unit 10.

A columnar support structure 46 is provided on the left side of the chuck table moving mechanism 36 as viewed in FIG. 1. The support structure 46 includes a support arm 48 projecting toward the position above the chuck table moving mechanism 36. A laser processing unit (processing unit) 50 for applying a laser beam downwardly is mounted on the tip side of the support arm 48. The laser processing unit 50 includes a laser oscillator (not illustrated) for oscillating a laser beam and a focusing lens 52 for focusing the laser beam oscillated from the laser oscillator and applying the focused laser beam to the workpiece 11 held on the chuck table 42. Accordingly, when the chuck table 42 is fed in the X direction as applying the laser beam from the laser processing unit 50 to the workpiece 11 held on the chuck table 42, the workpiece 11 can be processed by the laser beam along a line extending in the X direction. The configuration of the laser processing unit 50 may be suitably set and changed according to a processing method to be adopted. For example, in the case of modifying the inside of the workpiece 11 by adopting multiphoton absorption to thereby form a modified region (modified layer), a laser oscillator capable of oscillating a laser beam having a transmission wavelength to the workpiece 11 is incorporated in the laser processing unit 50. Further, in the case of processing the workpiece 11 by adopting the laser ablation, a laser oscillator capable of oscillating a laser beam having an absorption wavelength to the workpiece 11 is incorporated in the laser processing unit 50. The workpiece 11 (the frame unit 1) to be processed by the laser processing unit 50 is transferred by the transfer unit 10 from the right cassette 6 as viewed in FIG. 1, for example, whereas the workpiece 11 (the frame unit 1) processed by the laser processing unit 50 is transferred by the transfer unit 10 into the left cassette 6 as viewed in FIG. 1, for example.

All of the transfer unit 10 (control unit 34), the chuck table moving mechanism 36, the chuck table 42, and the laser processing unit 50 are connected to the control unit (not illustrated) for generally controlling the laser processing apparatus 2. This control unit functions to control all the components of the laser processing apparatus 2 so that the workpiece 11 is suitably processed.

Figure 2A:
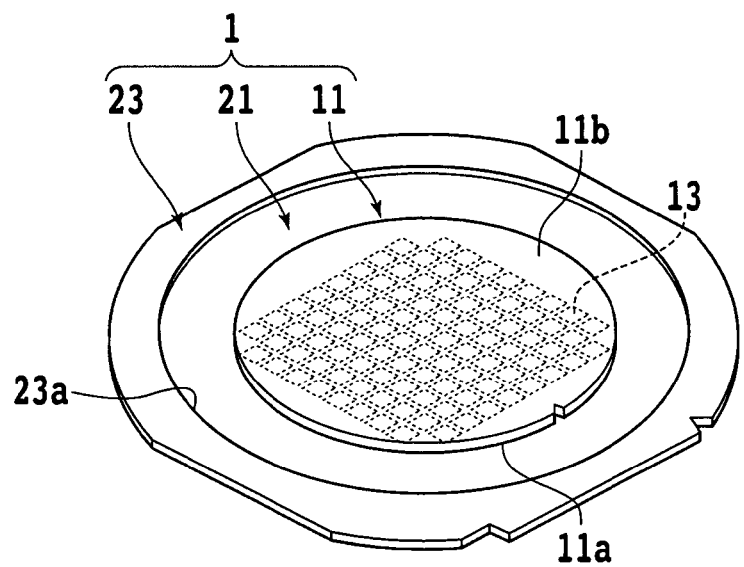
FIG. 2A is a schematic perspective view illustrating the configuration of a frame unit in a first mode.
Figure 2B:
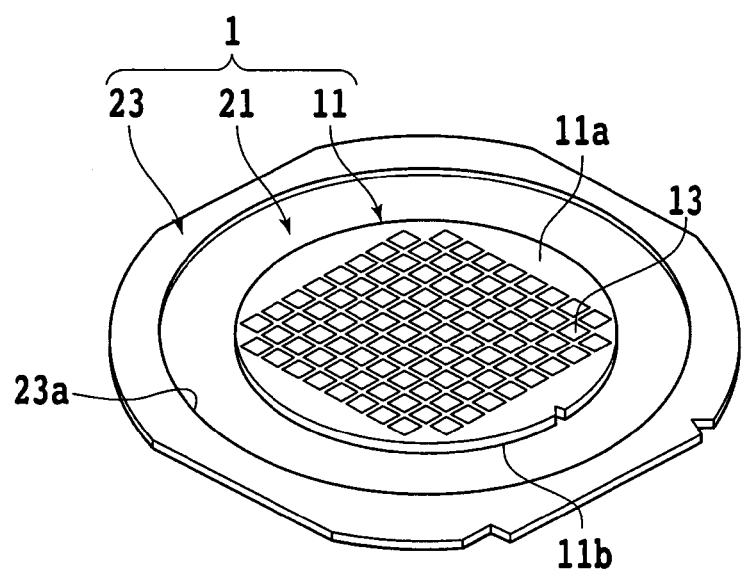
FIG. 2B is a schematic perspective view illustrating the configuration of a frame unit in a second mode.

The frame unit 1 to be transferred by the transfer unit 10 will now be described. FIG. 2A is a schematic perspective view illustrating the frame unit 1 in a first mode, and FIG. 2B is a schematic perspective view illustrating the configuration of the frame unit 1 in a second mode. The workpiece 11 constituting the frame unit 1 is a disk-shaped wafer formed of a semiconductor such as silicon. The workpiece 11 has a front side 11a and a back side 11b. The front side 11a of the workpiece 11 is composed of a central device area and a peripheral marginal area surrounding the device area. The device area is partitioned by a plurality of crossing division lines (streets) to thereby define a plurality of separate regions where a plurality of devices 13 such as integrated circuits (ICs), large-scale integration (LSI) circuits are individually formed. While the workpiece 11 is a disk-shaped wafer formed of a semiconductor such as silicon in this preferred embodiment, the material, shape, structure, size, etc. of the workpiece 11 are not limited. For example, the workpiece 11 may be a substrate formed of another semiconductor, ceramics, resin, or metal. Further, the kind, number, size, layout, etc. of the devices 13 are not limited.

In the first mode illustrated in FIG. 2A, a circular adhesive tape (tape) 21 having a diameter larger than that of the workpiece 11 is attached to the front side 11a of the workpiece 11. Further, a ring frame 23 is fixed to a peripheral portion of the adhesive tape 21. The ring frame 23 has an opening 23a, which is closed by a central portion of the adhesive tape 21, and the front side 11a of the workpiece 11 is attached to the central portion of the adhesive tape 21. Accordingly, the workpiece 11 is supported through the adhesive tape 21 to the ring frame 23, thus forming the frame unit 1. That is, the workpiece 11, the adhesive tape 21, and the ring frame 23 are united to form the frame unit 1. On the other hand, in the second mode illustrated in FIG. 2B, the adhesive tape 21 is attached to the back side 11b of the workpiece 11. The other configuration is the same as that of the first mode illustrated in FIG. 2A.

Figure 3:
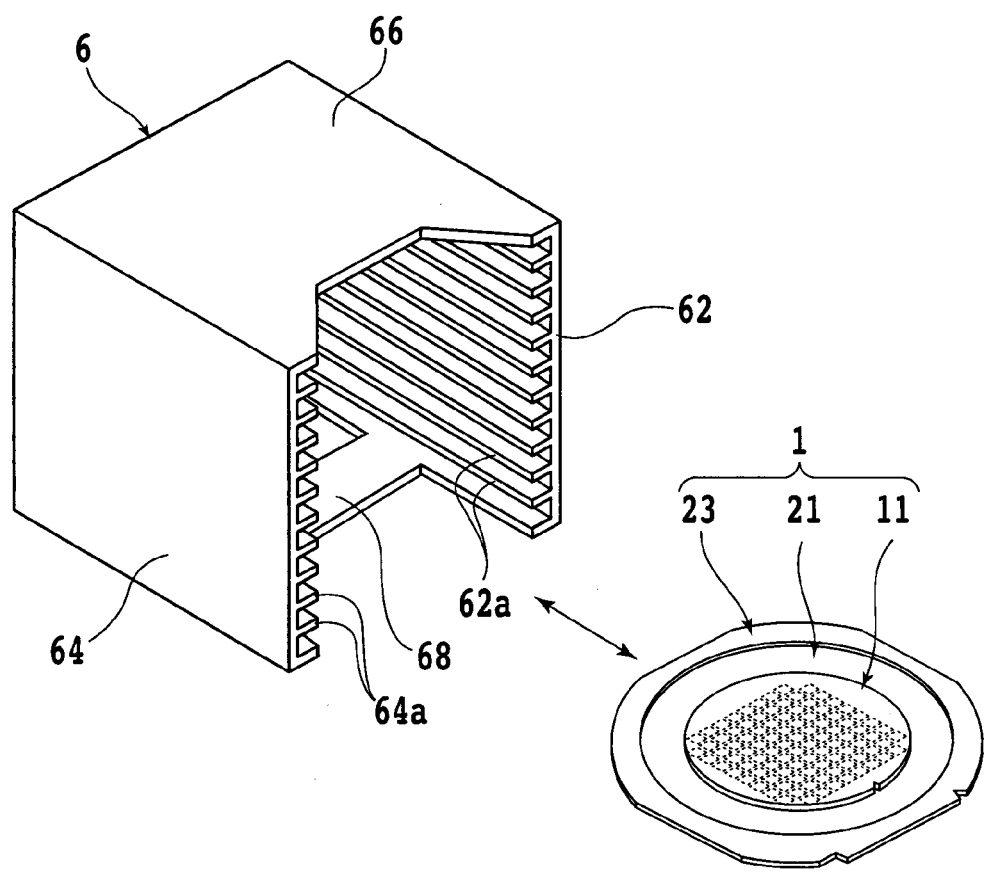
FIG. 3 is a schematic perspective view illustrating the configuration of a cassette.

There will now be described the configuration of each cassette 6 for storing a plurality of frame units 1, each of which is illustrated in FIG. 2A or 2B. FIG. 3 is a schematic perspective view illustrating the configuration of each cassette 6 illustrated in FIG. 1. As illustrated in FIG. 3, the cassette 6 has a pair of side plate portions 62 and 64 opposite to each other. That is, the inside surface of the side plate portion 62 is opposed to the inside surface of the side plate portion 64. The inside surface of the side plate portion 62 is formed with a plurality of horizontally extending shelf portions 62a. Similarly, the inside surface of the side plate portion 64 is formed with a plurality of horizontally extending shelf portions 64a. The plural shelf portions 62a are equally spaced in the vertical direction, and the plural shelf portions 64a are equally spaced in the vertical direction. The plural shelf portions 62a correspond to the plural shelf portions 64a in such a manner that each pair of corresponding shelf portions 62a and 64a are formed at the same height so as to horizontally support the frame unit 1. More specifically, a part of the ring frame 23 constituting the frame unit 1 is supported on each pair of corresponding shelf portions 62a and 64a. The side plate portions 62 and 64 are connected by a top plate portion 66, a bottom plate portion 68, and a back plate portion 70 (see FIGS. 3 and 4A).

Figure 4A:
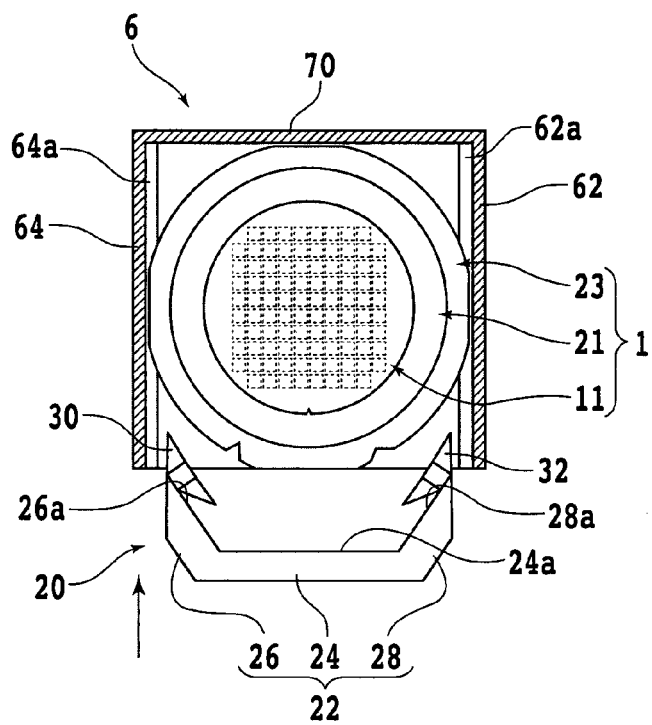
FIGS. 4A and 4B are partially sectional plan views for illustrating a manner of partially drawing the frame unit from the cassette.
Figure 4B:
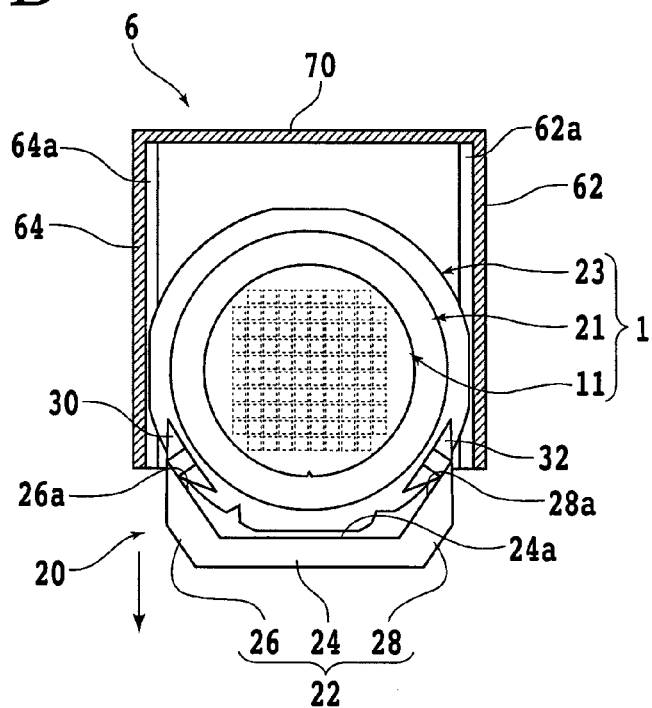

There will now be described a transfer method for transferring the frame unit 1 by using the transfer unit 10. First, the ring frame 23 of the frame unit 1 stored in the cassette 6 is gripped by the pair of gripping members 30 and 32 to partially draw the frame unit 1 from the cassette 6 (drawing step). FIGS. 4A and 4B are partially sectional plan views for illustrating the drawing step. More specifically, in performing the drawing step, the elevating mechanism 12 is first operated by the control unit 34 to vertically move the holding hand 20 to the same height as that of a target one of the plural frame units 1 stored in the cassette 6. Thereafter, the transfer arm 14 is operated by the control unit 34 to horizontally move the holding hand 20 to a position where the gripping members 30 and 32 can grip a front portion of the ring frame 23 at two separate positions as illustrated in FIG. 4A. Thereafter, the gripping members 30 and 32 are operated by the control unit 34 to grip the front portion of the ring frame 23 at the two separate positions. Thereafter, the transfer arm 14 is operated again to draw the frame unit 1 by a suitable amount as illustrated in FIG. 4B. The amount of drawing of the frame unit 1 is adjusted in such a range that the frame unit 1 does not fall from the cassette 6 even after canceling the gripping by the gripping members 30 and 32 and that the first abutting surface 24a can suitably abut against the frame unit 1 in a subsequent step.

Figure 5A:
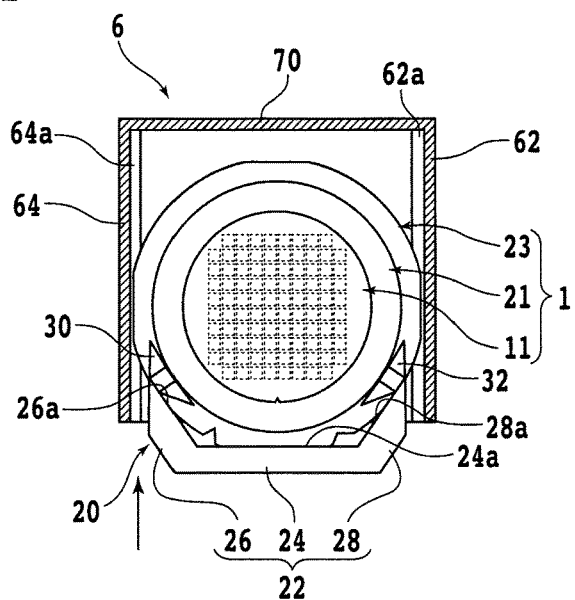
FIG. 5A is a partially sectional plan view for illustrating a manner of making a first abutting surface, a second abutting surface, and a third abutting surface abut against the outer circumference of a ring frame at its front portion.

After performing the drawing step to partially draw the frame unit 1 from the cassette 6, the gripping of the ring frame 23 by the gripping members 30 and 32 is canceled by the control unit 34. Thereafter, the first abutting surface 24a, the second abutting surface 26a, and the third abutting surface 28a of the holding hand 20 are brought into abutment against the outer circumference of the ring frame 23 at its front portion, so as to move the frame unit 1 (ring frame 23) into the cassette 6 (abutting step). FIG. 5A is a partially sectional plan view for illustrating the abutting step. More specifically, in performing the abutting step, the transfer arm 14 is first operated by the control unit 34 to move the holding hand 20 toward the cassette 6. Thereafter, as illustrated in FIG. 5A, the first, second, and third abutting surfaces 24a, 26a, and 28a of the holding hand 20 are brought into abutment against the outer circumference of the ring frame 23 at its front portion. Then, the holding hand 20 is further moved to slightly push the frame unit 1 into the cassette 6. Thereafter, the operation of the transfer arm 14 is stopped by the control unit 34. In this condition, the gripping members 30 and 32 are operated again to grip the front portion of the ring frame 23 at two separate positions.

In this manner, the holding hand 20 is moved to make the first, second, and third abutting surfaces 24a, 26a, and 28a abut against the outer circumference of the ring frame 23 at its front portion, after partially drawing the frame unit 1 from the cassette 6. Accordingly, the frame unit 1 can be suitably gripped without the need for inserting the holding hand 20 into the cassette 6 up to a deep position. That is, even in the case that the spacing between any adjacent ones of the plural frame units 1 stored in the cassette 6 is small, the target frame unit 1 can be suitably held by the holding hand 20 to be transferred.

Figure 5B:
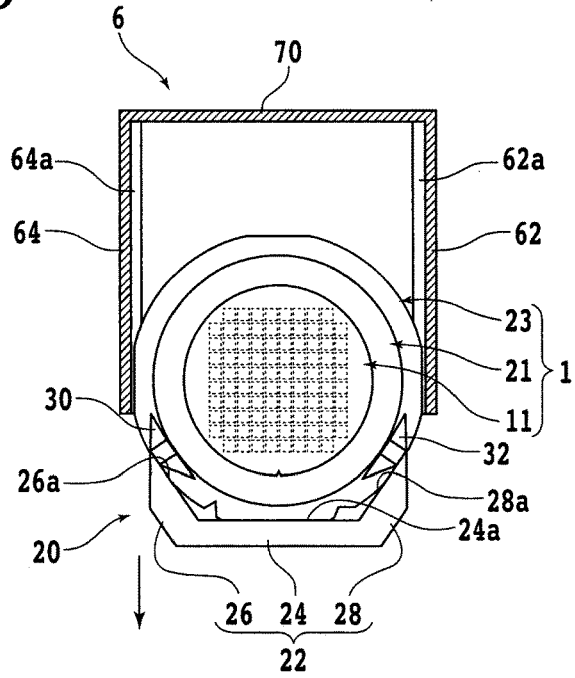
FIG. 5B is a partially sectional plan view for illustrating a manner of transferring the frame unit.

After performing the abutting step to grip the front portion of the ring frame 23 at two separate positions by using the gripping members 30 and 32 in the condition where the first to third abutting surfaces 24a to 28a abut against the outer circumference of the ring frame 23 at its front portion, the frame unit 1 (the ring frame 23) is slightly raised and then transferred to a predetermined position (transfer step). FIG. 5B is a partially sectional plan view for illustrating the transfer step. More specifically, in performing the transfer step, the elevating mechanism 12 is first operated by the control unit 34 in the condition where the ring frame 23 is gripped by the gripping members 30 and 32. Accordingly, the frame unit 1 is slightly raised by the holding hand 20. Thereafter, as illustrated in FIG. 5B, the transfer arm 14 is operated to fully draw the frame unit 1 from the cassette 6. Thereafter, the frame unit 1 is transferred to a predetermined position (e.g., chuck table 42) by operating the transfer arm 14.

As described above, the transfer unit (transfer apparatus) 10 according to this preferred embodiment has the pair of gripping members (gripping portions, gripping means) 30 and 32 for gripping the front portion of the ring frame 23 at two separate positions and the first, second, and third abutting surfaces (abutting portions, abutting means) 24a, 26a, and 28a adapted to abut against the outer circumference of the ring frame 23. Accordingly, the frame unit 1 stored in the cassette 6 can be reliably held and transferred by the transfer unit 10 in the following manner. That is, the ring frame 23 is first gripped by the gripping members 30 and 32 and then partially drawn from the cassette 6 by the transfer arm (moving unit, moving means) 14. After canceling the gripping by the gripping members 30 and 32, the first, second, and third abutting surfaces 24a, 26a, and 28a are brought into abutment against the outer circumference of the ring frame 23, so as to move the ring frame 23 into the cassette 6. In the condition where the first to third abutting surfaces 24a to 28a abut against the outer circumference of the ring frame 23, the ring frame 23 is gripped by the gripping members 30 and 32 and then raised by operating the elevating mechanism (moving unit, moving means) 12.

As described above, the ring frame 23 is gripped at two separate positions by the pair of gripping members 30 and 32. Accordingly, as compared with the case that the ring frame 23 is gripped at one position, deformation of the ring frame 23 can be suppressed and the frame unit 1 can therefore be stabilized. As a result, the frame unit 1 can be reliably held and can also be easily inverted. Further by making the first to third abutting surfaces 24a to 28a abut against the outer circumference of the ring frame 23, the frame unit 1 can be positioned in the cassette 6. Accordingly, in the condition where the frame unit 1 is positioned by the first to third abutting surfaces 24a to 28a, the ring frame 23 is gripped by the gripping members 30 and 32 to be transferred. As a result, it is unnecessary to position the frame unit 1 by using a centering mechanism as used in the prior art. That is, it is unnecessary to provide a centering mechanism requiring a considerable space in the processing apparatus. Accordingly, the configuration of the transfer unit 10 is also suitable for a reduction in size of the laser processing apparatus (processing apparatus) 2.

Figure 6A:
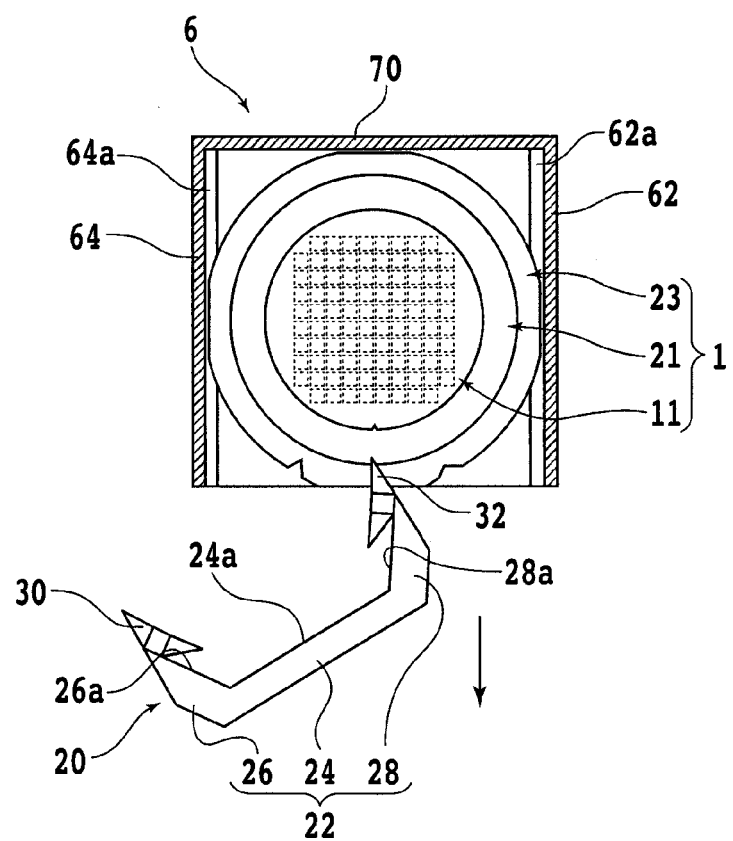
FIG. 6A is a partially sectional plan view for illustrating a manner of gripping the ring frame by using a gripping member in partially drawing the frame unit from the cassette.

The present invention is not limited to the above preferred embodiment, but various modifications may be made. For example, while the ring frame 23 is gripped by the pair of gripping members 30 and 32 in partially drawing the frame unit 1 from the cassette 6 in the above preferred embodiment, the ring frame 23 may be gripped by one of the gripping members 30 and 32. FIG. 6A is a partially sectional plan view for illustrating such a modification that the ring frame 23 is gripped by only the gripping member 32 in partially drawing the frame unit 1 from the cassette 6. In this modification, the transfer arm 14 is first operated by the control unit 34 to move the holding hand 20 to a position where the gripping member 32 can grip the front portion of the ring frame 23 at one position. Thereafter, the gripping member 32 is operated by the control unit 34 to grip the front portion of the ring frame 23 at this one position. Thereafter, the transfer arm 14 is operated again to partially draw the frame unit 1 by a suitable amount. In this case, as illustrated in FIG. 6A, it is sufficient that a part of the gripping member 32 is to be inserted into the cassette 6. Accordingly, even in the case that the spacing between any adjacent ones of the plural frame units 1 stored in the cassette 6 becomes smaller, the target frame unit 1 can be suitably drawn from the cassette 6.

Figure 6B:
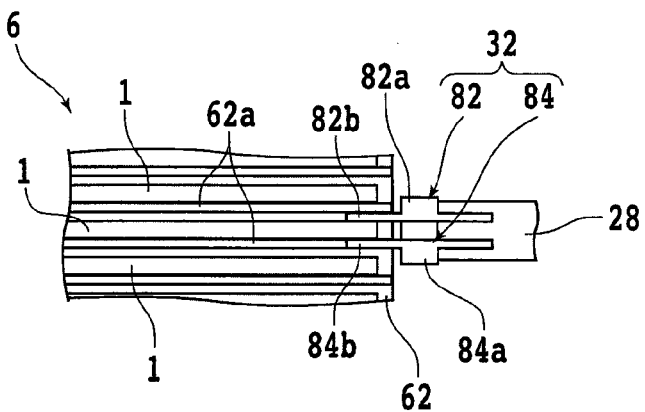
FIG. 6B is a sectional view for illustrating a gripping member partially reduced in thickness.

In this case, a part of the gripping member 32 to be inserted into the cassette 6 is preferably formed to have a small thickness. FIG. 6B is a vertical sectional view for illustrating such a modification that a part of the gripping member 32 has a small thickness. As illustrated in FIG. 6B, the gripping member 32 has an upper lug 82 and a lower lug 84 for cooperatively gripping the ring frame 23. The upper lug 82 has a thick central portion 82a and a thin front portion 82b having a thickness smaller than that of the thick central portion 82a. The thick central portion 82a has an increased thickness for the purpose of ensuring rigidity. Similarly, the lower lug 84 has a thick central portion 84a and a thin front portion 84b having a thickness smaller than that of the thick central portion 84a. The thick central portion 84a has an increased thickness for the purpose of ensuring rigidity. In partially drawing the frame unit 1 from the cassette 6, the front portion 82b of the upper lug 82 and the front portion 84b of the lower lug 84 are inserted into the cassette 6 so as to interpose the target frame unit 1. Thereafter, the gripping member 32 is operated to grip the ring frame 23 between the front portion 82b of the upper lug 82 and the front portion 84b of the lower lug 84. Accordingly, even in the case that the spacing between any adjacent ones of the plural frame units 1 stored in the cassette 6 is further reduced, the frame unit 1 can be suitably drawn from the cassette 6. While the gripping member 32 is used in this modification, the other gripping member 30 may be used instead in partially drawing the frame unit 1 from the cassette 6.

While the laser processing apparatus 2 is adopted as an example of the processing apparatus according to the present invention, any other processing apparatuses such as a cutting apparatus, a grinding apparatus, and a polishing apparatus may be adopted as the processing apparatus of the present invention. The cutting apparatus includes a cutting unit (processing unit) having an annular cutting blade, in place of the laser processing unit 50. The grinding apparatus includes a grinding unit (processing unit) having a grinding wheel with abrasive members, in place of the laser processing unit 50. The polishing apparatus includes a polishing unit (processing unit) having a polishing pad, in place of the laser processing unit 50.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A transfer apparatus for transferring a frame unit from a cassette to a predetermined position, said frame unit being composed of a platelike workpiece, a tape attached to said workpiece, and a ring frame supporting a peripheral portion of said tape, said ring frame having an opening closed by said tape for receiving said workpiece, said transfer apparatus comprising:
a holding unit for holding said frame unit, said holding unit having a pair of gripping portions for gripping a front portion of said ring frame at two separate positions and an abutting portion adapted to abut against the outer circumference of said ring frame;
a moving unit for moving said holding unit; and
a control unit for controlling said holding unit and said moving unit;
said control unit controlling said holding unit and said moving unit by performing the steps of gripping said ring frame by operating said gripping portions, next partially drawing said ring frame from said cassette by operating said moving unit, next canceling the gripping of said ring frame by operating said gripping portions, next bringing said abutting portion into abutment against the outer circumference of said ring frame so as to move said ring frame into said cassette by operating said moving unit, next gripping said ring frame again by operating said gripping portions, next raising said ring frame by operating said moving unit, and finally transferring said ring frame to said predetermined position by operating said moving unit.

2. A processing apparatus comprising:

a transfer unit for transferring a frame unit from a cassette to a predetermined position, said frame unit being composed of a platelike workpiece, a tape attached to said workpiece, and a ring frame supporting a peripheral portion of said tape, said ring frame having an opening closed by said tape for receiving said workpiece;

a chuck table for holding said workpiece;

a processing unit for processing said workpiece held on said chuck table; and a cassette mounting area for mounting said cassette;

said transfer unit including holding unit for holding said frame unit, said holding unit having a pair of gripping portions for gripping a front portion of said ring frame at two separate positions and an abutting portion adapted to abut against the outer circumference of said ring frame, moving unit for moving said holding unit, and control unit for controlling said holding unit and said moving unit;

said control unit controlling said holding unit and said moving unit by performing the steps of gripping said ring frame by operating said gripping portions, next partially drawing said ring frame from said cassette by operating said moving unit, next canceling the gripping of said ring frame by operating said gripping portions, next bringing said abutting portion into abutment against the outer circumference of said ring frame so as to move said ring frame into said cassette by operating said moving unit, next gripping said ring frame again by operating said gripping portions, next raising said ring frame by operating said moving unit, and finally transferring said ring frame to said chuck table by operating said moving unit.

3. A transfer method for transferring a frame unit from a cassette to a predetermined position, said frame unit being composed of a platelike workpiece, a tape attached to said workpiece, and a ring frame supporting a peripheral portion of said tape, said ring frame having an opening closed by said tape for receiving said workpiece, said transfer method being performed by using a transfer apparatus including holding unit for holding said frame unit, said holding unit having a pair of gripping portions for gripping a front portion of said ring frame at two separate positions and abutting portion adapted to abut against the outer circumference of said ring frame, moving unit for moving said holding unit, and control unit for controlling said holding unit and said moving unit, said transfer method comprising:

a drawing step of gripping said ring frame by operating at least one of said pair of gripping portions and next partially drawing said ring frame from said cassette by operating said moving unit;

an abutting step of canceling the gripping of said ring frame by operating said at least one of said pair of gripping portions after performing said drawing step, and next bringing said abutting portion into abutment against the outer circumference of said ring frame so as to move said ring frame into said cassette by operating said moving unit; and a transfer step of gripping said ring frame by operating said pair of gripping portions after performing said abutting step, next raising said ring frame by operating said moving unit, and finally transferring said ring frame to said predetermined position by operating said moving unit.

* * * * *